US012596852B2

(12) United States Patent
Ivanov et al.

(10) Patent No.: US 12,596,852 B2
(45) Date of Patent: Apr. 7, 2026

(54) COMPUTING DEVICE AND METHOD FOR UPDATING A MODEL OF A BUILDING

(71) Applicant: HERE Global B.V., Eindhoven (NL)

(72) Inventors: Pavel Ivanov, Tampere (FI); Henri Jaakko Julius Nurminen, Tampere (FI); Lauri Aarne Johannes Wirola, Tampere (FI); Marko Tapio Luomi, Lempäälä (FI)

(73) Assignee: HERE GLOBAL B.V., Eindhoven (NL)

( * ) Notice: Subject to any disclaimer, the term of this patent is extended or adjusted under 35 U.S.C. 154(b) by 898 days.

(21) Appl. No.: 17/893,394

(22) Filed: Aug. 23, 2022

(65) Prior Publication Data

US 2024/0070336 A1     Feb. 29, 2024

(51) Int. Cl.
*G06F 30/13*          (2020.01)
(52) U.S. Cl.
CPC .................................... *G06F 30/13* (2020.01)
(58) Field of Classification Search
CPC ................................ G06F 30/00; G06F 30/13
USPC ............................................................ 703/1
See application file for complete search history.

(56) References Cited

U.S. PATENT DOCUMENTS 8,026,929 B2     9/2011   Naimark
9,430,871 B2     8/2016   Neophytou et al.
9,437,033 B2     9/2016   Sun et al.
10,410,412 B2    9/2019   Upendran et al.
11,069,145 B1 *  7/2021   Pearson ................. G06T 19/006
11,506,499 B2    11/2022  Ivanov et al.
2012/0044247 A1 * 2/2012  Naimark ............... G06T 15/205
                                                345/419
2014/0267254 A1 * 9/2014  Sievert .................... G06T 17/00
                                                345/420

OTHER PUBLICATIONS

Jang, Kyung Ho et al., "Practical Modeling Technique for Large-Scale 3D Building Models from Ground Images", Apr. 18, 2009, Pattern Recognition Letters 30, Elsevier B.V. (Year: 2009).*

* cited by examiner

*Primary Examiner* — Cedric Johnson
(74) *Attorney, Agent, or Firm* — Jeffrey R. Moisan; HERE GLOBAL B.V.

(57)          ABSTRACT

A computing device, method and computer program product are provided to update the model of a building. In the context of a method, an image of a building and information regarding a location from which the image was captured are obtained. The method also includes causing a model of the building and the image of the building to be presented. Based on feedback from presentation of the model of the building and the image of the building, the method includes updating the model of the building by adjusting one or more parameters, including one or more vertical parameters, defining the model of the building. The method further includes causing the updated model of the building and the image of the building to be presented.

20 Claims, 5 Drawing Sheets

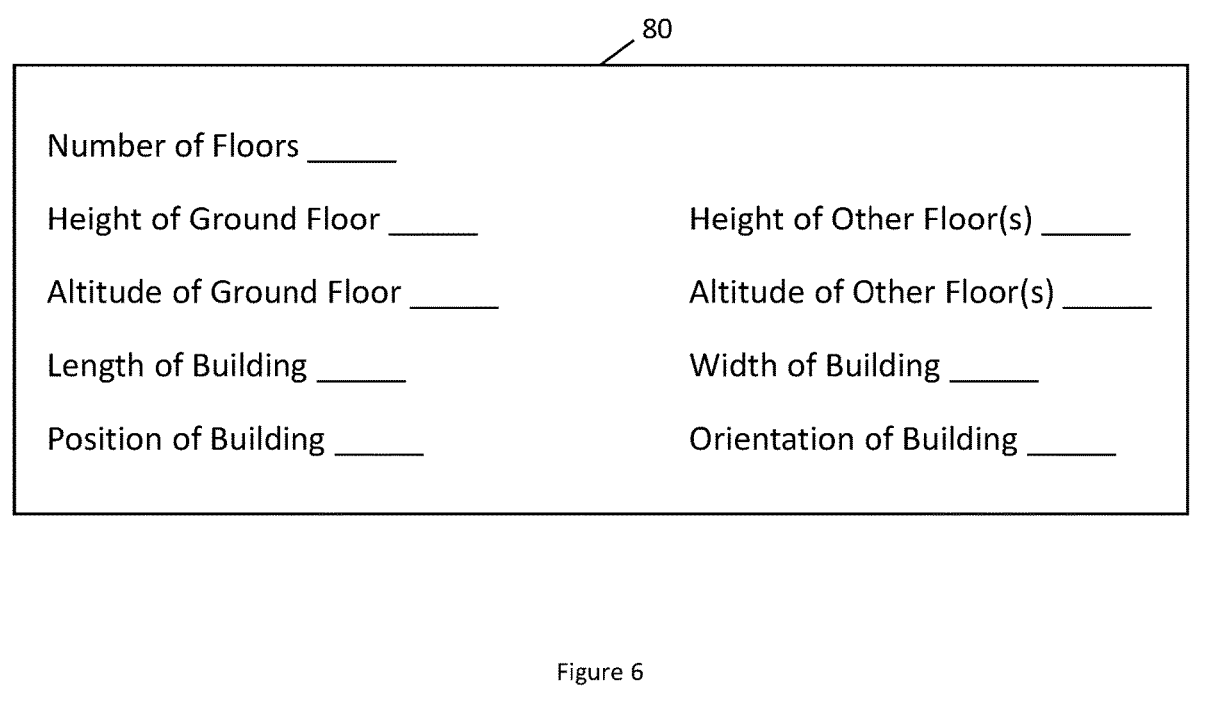

80

Number of Floors _____

Height of Ground Floor _____          Height of Other Floor(s) _____

Altitude of Ground Floor _____          Altitude of Other Floor(s) _____

Length of Building _____          Width of Building _____

Position of Building _____          Orientation of Building _____

Figure 6

COMPUTING DEVICE AND METHOD FOR UPDATING A MODEL OF A BUILDING

TECHNOLOGICAL FIELD

An example embodiment relates generally to a computing device, a method and computer program product for updating the model of a building and, more particularly, to a computing device, a method and computer program product for updating the model of a building based upon an image that is captured of the building.

BACKGROUND

Models of buildings in a geographical coordinate frame are utilized for a variety of purposes. For example, building models may be utilized for visualization of the buildings, such as in conjunction with mapping or navigation applications. In this regard, a building model may provide a two or three dimensional representation of a building that is presented such that a user of a mapping or navigation application can more readily visualize the surroundings, including the building. The resulting visualization of an environment may be useful in a variety of settings including, for example, in an urban setting.

For multi-story buildings having a plurality of floors, the building models may also include information regarding the different floors. This information can be utilized for localization purposes, such as to facilitate the localization of a mobile device, e.g., a mobile device carried by user who is located on one of the floors of a building. In this regard, information provided by a building model regarding the floors of the building may be referenced in order to identify the floor on which a mobile device is likely located. This improved localization can facilitate the provision of improved navigational instructions for the user of the mobile device and/or provide improved support for other applications that rely upon the accurate identification of the location of a mobile device.

Building models, such as the models of multi-store buildings, do not consistently include detailed information regarding the various parameters of the building, such as the number of floors of the building, the spacing of the floors, etc., and the information maintained by the models of the building may sometimes be less accurate than desired. For example, the information from which a building model is constructed may be provided by the technical documentation associated with the building. However, it may be difficult to obtain such technical documentation such that resulting model of the building may be incomplete. In another example, crowd-sourced data is collected and analyzed to construct the model of a building. Particularly in instances in which the data quantities are low, however, the crowd-sourced data may not provide sufficient information to develop a detailed model of the building.

As such, at least some building models represent the building as a basic 3-dimensional shape with little, if any, information regarding the individual floors of the building. The resulting building model may therefore provide for lower quality visualization of the building, such as for a mapping or navigation application, and reduced accuracy in relation to the localization of a mobile device that is carried by a user present on a floor of the building.

BRIEF SUMMARY

A computing device, method and computer program product are provided in accordance with an example embodiment in order to update the model of a building. A computing device, method and computer program product of an example embodiment update the model of the building based upon a comparison of the model of the building with an image of the same building. Based upon this comparison, the model is updated by adjusting one or more parameters that define the model of the building. Once the model of the building has been updated, the resulting model may more accurately represent the building and the individual floors within the building. As such, the updated model of the building may provide for improved and more accurate visualization of the building, such as in conjunction with a mapping or navigation application. Additionally, the updated model of the building may provide additional and more accurate information regarding the individual floors of the building so as to improve the accuracy with which a user device, such as a mobile device, on one of the floors may be located, thereby enhancing navigation and other applications that rely upon the accurate determination of the location of a user device.

In an example embodiment, a computing device is provided that includes processing circuitry and at least one memory including computer program code with the at least one memory and the computer program code configured to, with the processing circuitry, cause the computing device at least to obtain an image of a building and information regarding a location from which the image was captured. The at least one memory and the computer program code are also configured to, with the processing circuitry, cause the computing device to cause a model of the building and the image of the building to be presented. Based on feedback from presentation of the model of the building and the image of the building, the at least one memory and the computer program code are configured to, with the processing circuitry, cause the computing device to update the model of the building by adjusting one or more parameters, including one or more vertical parameters, defining the model of the building. The at least one memory and the computer program code are further configured to, with the processing circuitry, cause the computing device to cause the updated model of the building and the image of the building to be presented.

The at least one memory and the computer program code are configured to, with the processing circuitry, cause the computing device of an example embodiment to update the model of the building by automatically adjusting the one or more parameters defining the model of the building in response to feedback in the form of manual feedback provided during presentation of the model of the building and the image of the building. Alternatively, the at least one memory and the computer program code are further configured to, with the processing circuitry, cause the computing device of an example embodiment to perform an automated analysis of the model of the building and the image of the building that are presented and to provide the feedback based on the automated analysis.

The at least one memory and the computer program code are further configured to, with the processing circuitry, cause the computing device of an example embodiment to obtain information regarding an orientation of an image capturing device upon capturing the image of the building. In this example embodiment, the at least one memory and the computer program code are further configured to, with the processing circuitry, cause the computing device to obtain the model of the building and to be caused to present the model of the building by being caused to present the model of at least that portion of the building appearing in the image captured by the image capturing device having the orientation and being at the location.

The computing device is caused to present the model of the building and the image of the building by being caused to overlay the model of the building and the image of the building. In an example embodiment, the one or more vertical parameters include at least one of: (i) a number of floors, (ii) respective heights of one or more of the floors or (iii) respective altitudes of one or more of the floors. The one or more parameters that are adjusted may also include one or more horizontal parameters including at least one of a length of the building, a width of the building, a position of the building or an orientation of the building.

In an example embodiment in which the feedback is received via a user interface, the at least one memory and the computer program code are further configured to, with the processing circuitry, repeatedly cause the updated model of the building and the image of the building to be presented in order to obtain additional feedback from which the model of the building is updated until an indication is received denoting a sufficient match between the updated model of the building and the image of the building. In this example embodiment, the at least one memory and the computer program code are further configured to, with the processing circuitry, receive the feedback via the user interface of a user device that is also configured to present the model of the building and the image of the building.

In another example embodiment, a method is provided that includes obtaining an image of a building and information regarding a location from which the image was captured. The method also includes causing a model of the building and the image of the building to be presented. Based on feedback from presentation of the model of the building and the image of the building, the method includes updating the model of the building by adjusting one or more parameters, including one or more vertical parameters, defining the model of the building. The method further includes causing the updated model of the building and the image of the building to be presented.

The method of an example embodiment updates the model of the building by automatically adjusting the one or more parameters defining the model of the building in response to feedback in the form of manual feedback provided during presentation of the model of the building and the image of the building. Alternatively, the method of an example embodiment includes performing an automated analysis of the model of the building and the image of the building that are presented and providing the feedback based on the automated analysis. The method of an example embodiment further includes obtaining information regarding an orientation of an image capturing device upon capturing the image of the building. In this example embodiment, the method obtains the model of the building and causes the model of the building to be presented by presenting the model of at least that portion of the building appearing in the image captured by the image capturing device having the orientation and being at the location.

The method of an example embodiment presents the model of the building and the image of the building by overlaying the model of the building and the image of the building. In an example embodiment, the one or more vertical parameters include at least one of: (i) a number of floors, (ii) respective heights of one or more of the floors or (iii) respective altitudes of one or more of the floors. The one or more parameters that are adjusted may also include one or more horizontal parameters including at least one of a length of the building, a width of the building, a position of the building or an orientation of the building.

In an example embodiment in which the feedback is received via a user interface, the method further includes repeatedly causing the updated model of the building and the image of the building to be presented in order to obtain additional feedback from which the model of the building is updated until an indication is received denoting a sufficient match between the updated model of the building and the image of the building. In this example embodiment, the method further includes receiving the feedback via the user interface of a user device that is also configured to present the model of the building and the image of the building.

In a further example embodiment, a computer program product is provided that includes at least one non-transitory computer-readable storage medium having computer-executable program code instructions stored therein with the computer-executable program code instructions including program code instructions configured to obtain an image of a building and information regarding a location from which the image was captured. The computer-executable program code instructions also include program code instructions configured to cause a model of the building and the image of the building to be presented. Based on feedback from presentation of the model of the building and the image of the building, the computer-executable program code instructions also include program code instructions configured to update the model of the building by adjusting one or more parameters, including one or more vertical parameters, defining the model of the building. The computer-executable program code instructions further include program code instructions configured to cause the updated model of the building and the image of the building to be presented.

The program code instructions configured to update the model of the building include program code instructions configured to automatically adjust the one or more parameters defining the model of the building in response to feedback in the form of manual feedback provided during presentation of the model of the building and the image of the building. Alternatively, the program code instructions of an example embodiment are configured to perform an automated analysis of the model of the building and the image of the building that are presented and to provide the feedback based on the automated analysis.

The computer-executable program code instructions of an example embodiment also include program code instructions configured to obtain information regarding an orientation of an image capturing device upon capturing the image of the building. In this example embodiment, the computer-executable program code instructions further include program code instructions configured to obtain the model of the building and the program code instructions configured to cause the model of the building to be presented include program code instructions configured to cause presentation of the model of at least that portion of the building appearing in the image captured by the image capturing device having the orientation and being at the location.

The program code instructions of an example embodiment that are configured to cause the model of the building and the image of the building to be presented include program code instructions configured to overlay the model of the building and the image of the building. In an example embodiment, the one or more vertical parameters include at least one of: (i) a number of floors, (ii) respective heights of one or more of the floors or (iii) respective altitudes of one or more of the floors. The one or more parameters that are adjusted may also include one or more horizontal parameters including at least one of a length of the building, a width of the building, a position of the building or an orientation of the building.

In an example embodiment in which the feedback is received via a user interface, the computer-executable program code instructions further include program code instructions configured to repeatedly cause the updated model of the building and the image of the building to be presented in order to obtain additional feedback from which the model of the building is updated until an indication is received denoting a sufficient match between the updated model of the building and the image of the building. In this example embodiment, the computer-executable program code instructions further include program code instructions configured to receive the feedback via the user interface of a user device that is also configured to present the model of the building and the image of the building.

In yet another example embodiment, an apparatus is provided that includes means for obtaining an image of a building and information regarding a location from which the image was captured. The apparatus also includes means for causing a model of the building and the image of the building to be presented. Based on feedback from presentation of the model of the building and the image of the building, the means for updating the model of the building includes means for adjusting one or more parameters, including one or more vertical parameters, defining the model of the building. The apparatus further includes means for causing the updated model of the building and the image of the building to be presented.

The means for updating the model of the building may include means for automatically adjusting the one or more parameters defining the model of the building in response to the feedback in the form of manual feedback provided during presentation of the model of the building and the image of the building. Alternatively, the apparatus of an example embodiment includes means for performing an automated analysis of the model of the building and the image of the building that are presented and means for providing the feedback based on the automated analysis. The apparatus of an example embodiment further includes means for obtaining information regarding an orientation of an image capturing device upon capturing the image of the building. In this example embodiment, the apparatus includes means for obtaining the model of the building and the means for causing the model of the building to be presented includes means for presenting the model of at least that portion of the building appearing in the image captured by the image capturing device having the orientation and being at the location.

The means for presenting the model of the building and the image of the building may include means for overlaying the model of the building and the image of the building. In an example embodiment, the one or more vertical parameters include at least one of: (i) a number of floors, (ii) respective heights of one or more of the floors or (iii) respective altitudes of one or more of the floors. The one or more parameters that are adjusted may also include one or more horizontal parameters including at least one of a length of the building, a width of the building, a position of the building or an orientation of the building.

In an example embodiment in which the feedback is received via a user interface, the apparatus further includes means for repeatedly causing the updated model of the building and the image of the building to be presented in order to obtain additional feedback from which the model of the building is updated until an indication is received denoting a sufficient match between the updated model of the building and the image of the building. In this example embodiment, the apparatus further includes means for receiving the feedback via the user interface of a user device that is also configured to present the model of the building and the image of the building.

In an example embodiment, a computing device is provided that includes processing circuitry and at least one memory including computer program code with the at least one memory and the computer program code configured to, with the processing circuitry, cause the computing device at least to obtain an image of a building and information regarding a location from which the image was captured. The at least one memory and the computer program code are also configured to, with the processing circuitry, cause the computing device to cause a model of the building and the image of the building to be presented. During and in response to presentation of the model of the building and the image of the building, the at least one memory and the computer program code are configured to, with the processing circuitry, cause the computing device to receive input modifying one or more parameters, including one or more vertical parameters, that define the model of the building. The at least one memory and the computer program code are also configured to, with the processing circuitry, cause the computing device to update the model of the building based on the input and to repeatedly cause the updated model of the building and the image of the building to be presented in order to obtain additional input based on which the model of the building is further updated until an indication is received denoting a sufficient match between the model of the building and the image of the building.

The at least one memory and the computer program code are further configured to, with the processing circuitry, cause the computing device of an example embodiment to obtain information regarding an orientation of an image capturing device upon capturing the image of the building. The at least one memory and the computer program code are further configured to, with the processing circuitry, cause the computing device to obtain the model of the building. In this example embodiment, the computing device being caused to present the model of the building includes the computing device being caused to present the model of at least that portion of the building appearing in the image captured by the image capturing device having the orientation and being at the location. The one or more vertical parameters may include at least one of: (i) a number of floors, (ii) respective heights of one or more of the floors or (iii) respective altitudes of one or more of the floors. In an example embodiment, the computing device being caused to receive input modifying one or more parameters includes the computing device being caused to receive input modifying one or more horizontal parameters including at least one of a length of the building, a width of the building, a position of the building or an orientation of the building.

In another example embodiment, a method is provided that includes obtaining an image of a building and information regarding a location from which the image was captured. The method also includes causing a model of the building and the image of the building to be presented. During and in response to presentation of the model of the building and the image of the building, the method includes receiving input modifying one or more parameters, including one or more vertical parameters, that define the model of the building. The method further includes updating the model of the building based on the input and repeatedly causing the updated model of the building and the image of the building to be presented in order to obtain additional input based on which the model of the building is further updated until an indication is received denoting a sufficient match between the model of the building and the image of the building.

The method further includes obtaining information regarding an orientation of an image capturing device upon capturing the image of the building. The method may include obtaining the model of the building. In this example embodiment, the method presents the model of the building by presenting the model of at least that portion of the building appearing in the image captured by the image capturing device having the orientation and being at the location. The one or more vertical parameters may include at least one of: (i) a number of floors, (ii) respective heights of one or more of the floors or (iii) respective altitudes of one or more of the floors. In an example embodiment, the method receiving input modifying one or more parameters includes receiving input modifying one or more horizontal parameters including at least one of a length of the building, a width of the building, a position of the building or an orientation of the building.

In a further example embodiment, a computer program product is provided that includes at least one non-transitory computer-readable storage medium having computer-executable program code instructions stored therein with the computer-executable program code instructions including program code instructions configured to obtain an image of a building and information regarding a location from which the image was captured. The computer-executable program code instructions also include program code instructions configured to cause a model of the building and the image of the building to be presented. During and in response to presentation of the model of the building and the image of the building, the computer-executable program code instructions also include program code instructions configured to receive input modifying one or more parameters, including one or more vertical parameters, that define the model of the building. The computer-executable program code instructions further include program code instructions configured to update the model of the building based on the input and program code instructions configured to repeatedly cause the updated model of the building and the image of the building to be presented in order to obtain additional input based on which the model of the building is further updated until an indication is received denoting a sufficient match between the model of the building and the image of the building.

The computer-executable program code instructions of an example embodiment further include program code instructions configured to obtain information regarding an orientation of an image capturing device upon capturing the image of the building. In an example embodiment, the computer-executable program code instructions further include program code instructions configured to obtain the model of the building. In this example embodiment, the program code instructions configured to cause the model of the building to be presented include program code instructions configured to cause presentation of the model of at least that portion of the building appearing in the image captured by the image capturing device having the orientation and being at the location. The one or more vertical parameters may include at least one of: (i) a number of floors, (ii) respective heights of one or more of the floors or (iii) respective altitudes of one or more of the floors. In an example embodiment, the program code instructions configured to receive input modifying one or more parameters includes the program code instructions configured to receive input modifying one or more horizontal parameters including at least one of a length of the building, a width of the building, a position of the building or an orientation of the building.

In yet another example embodiment, an apparatus is provided that includes means for obtaining an image of a building and information regarding a location from which the image was captured. The apparatus also includes means for causing a model of the building and the image of the building to be presented. During and in response to presentation of the model of the building and the image of the building, the apparatus includes means for receiving input modifying one or more parameters, including one or more vertical parameters, that define the model of the building. The apparatus further includes means for updating the model of the building based on the input and means for repeatedly causing the updated model of the building and the image of the building to be presented in order to obtain additional input based on which the model of the building is further updated until an indication is received denoting a sufficient match between the model of the building and the image of the building.

The apparatus further includes means for obtaining information regarding an orientation of an image capturing device upon capturing the image of the building. The apparatus may include means for obtaining the model of the building. In this example embodiment, the means for presenting the model of the building includes means for presenting the model of at least that portion of the building appearing in the image captured by the image capturing device having the orientation and being at the location. The one or more vertical parameters may include at least one of: (i) a number of floors, (ii) respective heights of one or more of the floors or (iii) respective altitudes of one or more of the floors. In an example embodiment, the means for receiving input modifying one or more parameters includes means for receiving input modifying one or more horizontal parameters including at least one of a length of the building, a width of the building, a position of the building or an orientation of the building.

In an example embodiment, a computing device includes processing circuitry and at least one memory including computer program code with the at least one memory and the computer program code being configured to, with the processing circuitry, cause the computing device at least to cause a model of a building and an image of the building to be presented. During and in response to presentation of the model of the building and the image of the building, the at least one memory and the computer program code are configured to, with the processing circuitry, cause the computing device to receive input via a user interface provided by the computing device. The input modifies one or more parameters, including one or more vertical parameters, that define the model of the building. The at least one memory and the computer program code are also configured to, with the processing circuitry, cause the computing device to provide information regarding the one or more parameters, as modified by the input. The at least one memory and the computer program code are further configured to, with the processing circuitry, cause the computing device to receive an updated model of the building and to cause the updated model of the building and the image of the building to be presented in order to obtain, via the user interface, (i) additional input based on which the model of the building is further updated or (ii) an indication denoting a sufficient match between the model of the building and the image of the building.

In regards to being caused to present the model of the building, the computing device of an example embodiment is caused to present the model of at least that portion of the building appearing in the image captured by an image capturing device. In an example embodiment, the computing device is caused to present the model of the building and the image of the building by being caused to overlay the model of the building and the image of the building. The one or more vertical parameters may include at least one of: (i) a number of floors, (ii) respective heights of one or more of the floors or (iii) respective altitudes of one or more of the floors. The computing device of an example embodiment is caused to receive input via the user interface modifying one or more parameters by being caused to receive input via the user interface modifying one or more horizontal parameters including at least one of a length of the building, a width of the building, a position of the building or an orientation of the building.

In another example embodiment, a method is provided that includes causing a model of a building and an image of the building to be presented. During and in response to presentation of the model of the building and the image of the building, the method includes receiving input via a user interface provided by the computing device. The input modifies one or more parameters, including one or more vertical parameters, that define the model of the building. The method also includes providing information regarding the one or more parameters, as modified by the input. The method further includes receiving an updated model of the building and causing the updated model of the building and the image of the building to be presented in order to obtain, via the user interface, (i) additional input based on which the model of the building is further updated or (ii) an indication denoting a sufficient match between the model of the building and the image of the building.

The method of an example embodiment causes the model of the building to be presented by causing the model of at least that portion of the building appearing in the image captured by an image capturing device to be presented. In an example embodiment, the method causes the model of the building and the image of the building to be presented by causing the model of the building and the image of the building to be overlayed. The one or more vertical parameters may include at least one of: (i) a number of floors, (ii) respective heights of one or more of the floors or (iii) respective altitudes of one or more of the floors. The method of an example embodiment receives input via the user interface modifying one or more parameters by receiving input via the user interface modifying one or more horizontal parameters including at least one of a length of the building, a width of the building, a position of the building or an orientation of the building.

In a further example embodiment, a computer program product is provided that includes at least one non-transitory computer-readable storage medium having computer-executable program code instructions stored therein with the computer-executable program code instructions including program code instructions configured to cause a model of a building and an image of the building to be presented. During and in response to presentation of the model of the building and the image of the building, the computer-executable program code instructions also include program code instructions configured to receive input via a user interface provided by the computing device. The input modifies one or more parameters, including one or more vertical parameters, that define the model of the building. The computer-executable program code instructions also include program code instructions configured to provide information regarding the one or more parameters, as modified by the input. The computer-executable program code instructions further include program code instructions configured to receive an updated model of the building and program code instructions configured to cause the updated model of the building and the image of the building to be presented in order to obtain, via the user interface, (i) additional input based on which the model of the building is further updated or (ii) an indication denoting a sufficient match between the model of the building and the image of the building.

In regards to being caused to present the model of the building, the program code instructions of an example embodiment are configured to cause presentation of the model of at least that portion of the building appearing in the image captured by an image capturing device. In an example embodiment, the program code instructions configured to cause presentation of the model of the building and the image of the building includes program code instructions configured to overlay the model of the building and the image of the building. The one or more vertical parameters may include at least one of: (i) a number of floors, (ii) respective heights of one or more of the floors or (iii) respective altitudes of one or more of the floors. In an example embodiment, the program code instructions configured to receive input via the user interface modifying one or more parameters includes program code instructions configured to receive input via the user interface modifying one or more horizontal parameters including at least one of a length of the building, a width of the building, a position of the building or an orientation of the building.

In yet another example embodiment, an apparatus is provided that includes means for causing a model of a building and an image of the building to be presented. During and in response to presentation of the model of the building and the image of the building, the apparatus includes means for receiving input via a user interface provided by the computing device. The input modifies one or more parameters, including one or more vertical parameters, that define the model of the building. The apparatus also includes means for providing information regarding the one or more parameters, as modified by the input. The apparatus further includes means for receiving an updated model of the building and means for causing the updated model of the building and the image of the building to be presented in order to obtain, via the user interface, (i) additional input based on which the model of the building is further updated or (ii) an indication denoting a sufficient match between the model of the building and the image of the building.

The means for causing the model of the building to be presented includes, in one embodiment, means for causing the model of at least that portion of the building appearing in the image captured by an image capturing device to be presented. In an example embodiment, the means for causing the model of the building and the image of the building to be presented includes means for causing the model of the building and the image of the building to be overlayed. The one or more vertical parameters may include at least one of: (i) a number of floors, (ii) respective heights of one or more of the floors or (iii) respective altitudes of one or more of the floors. In an example embodiment, the means for receiving input via the user interface modifying one or more parameters includes means for receiving input via the user interface modifying one or more horizontal parameters including at least one of a length of the building, a width of the building, a position of the building or an orientation of the building.

BRIEF DESCRIPTION OF THE DRAWINGS

Figure 1:
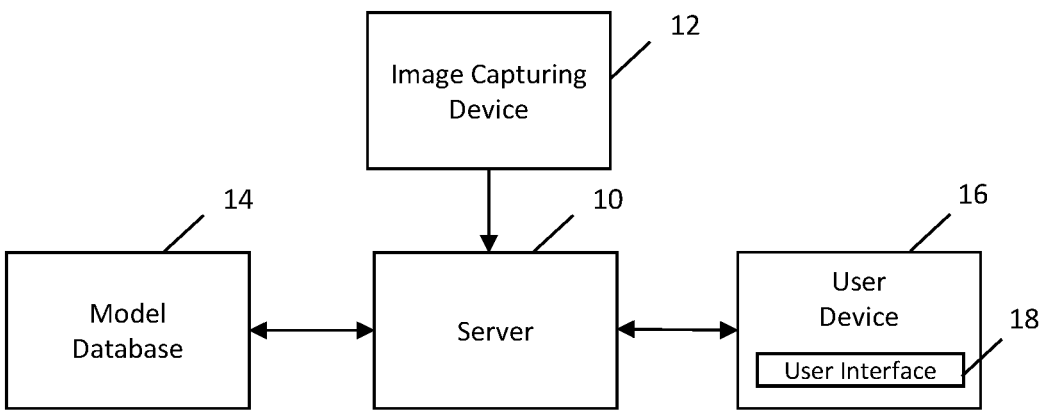
Figure 2:
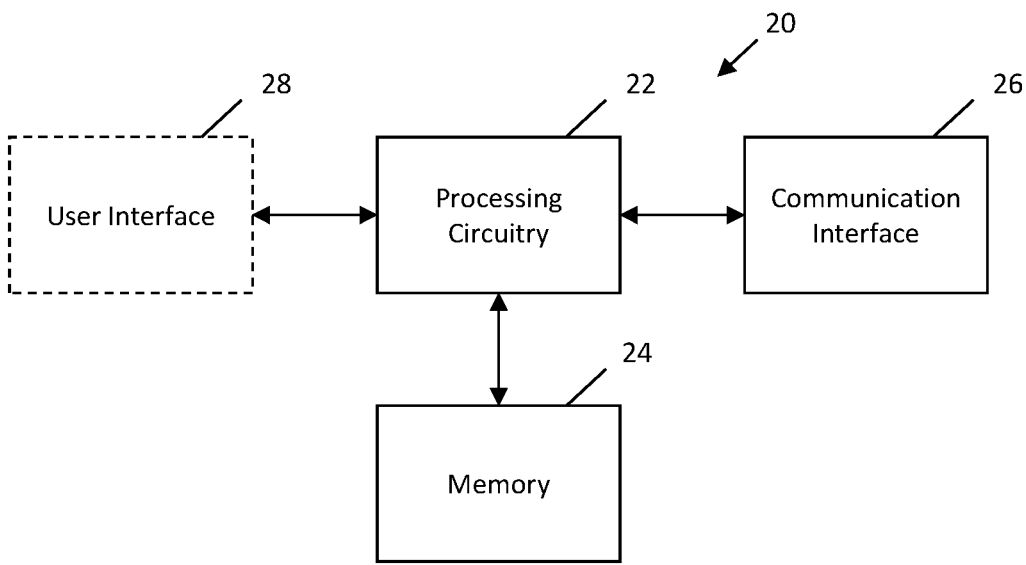
Figure 3:
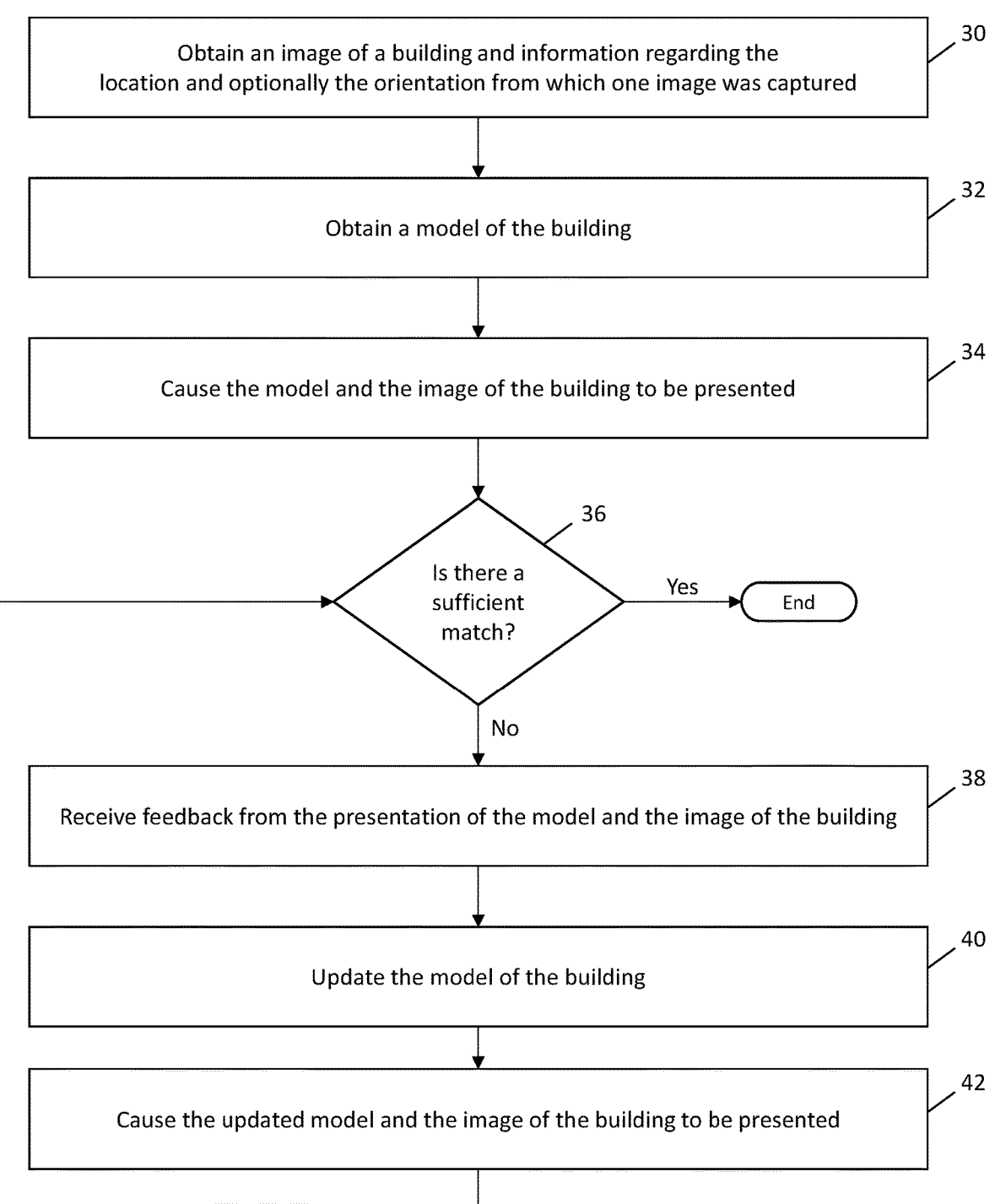
Figure 4:
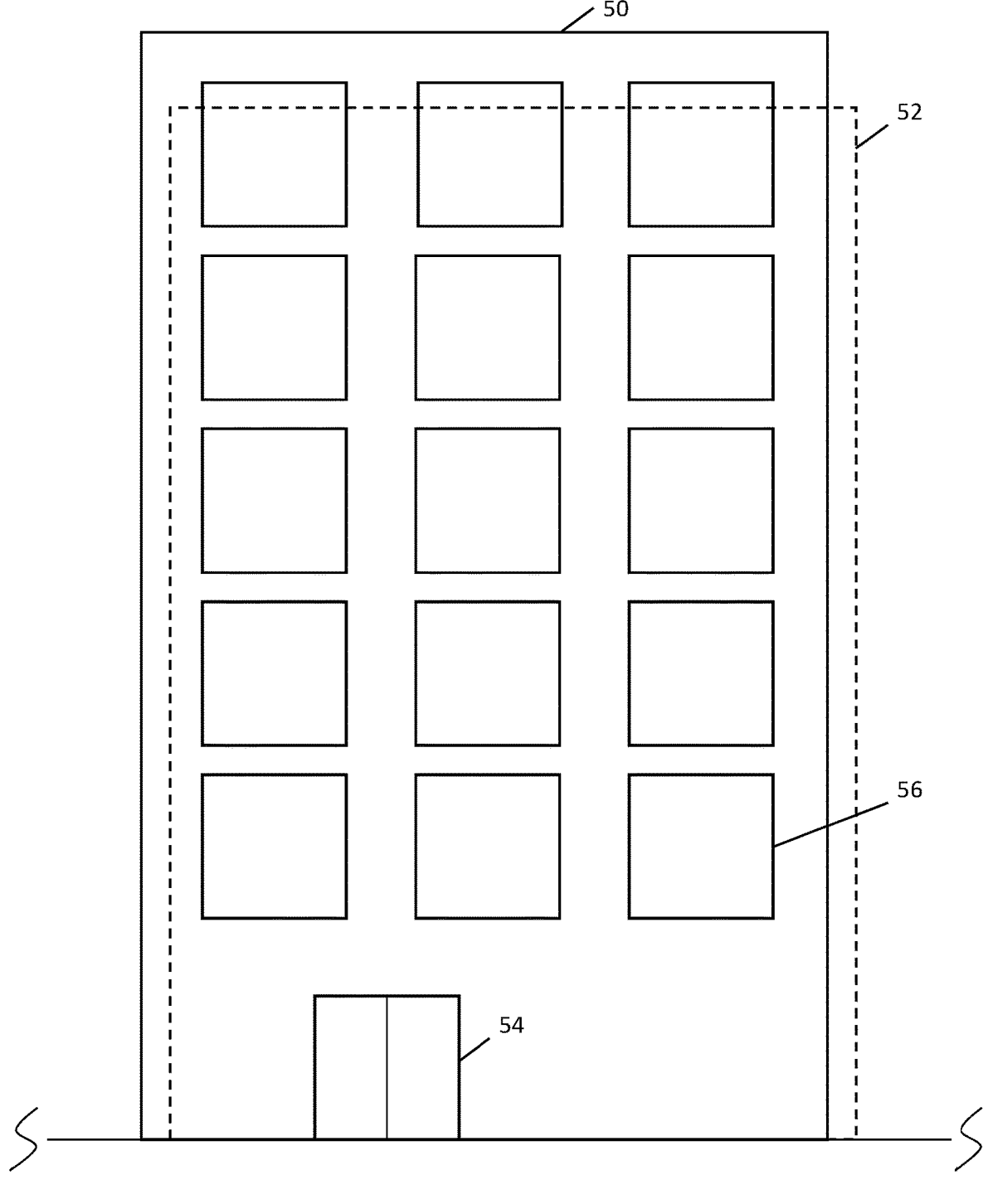
Figure 5:
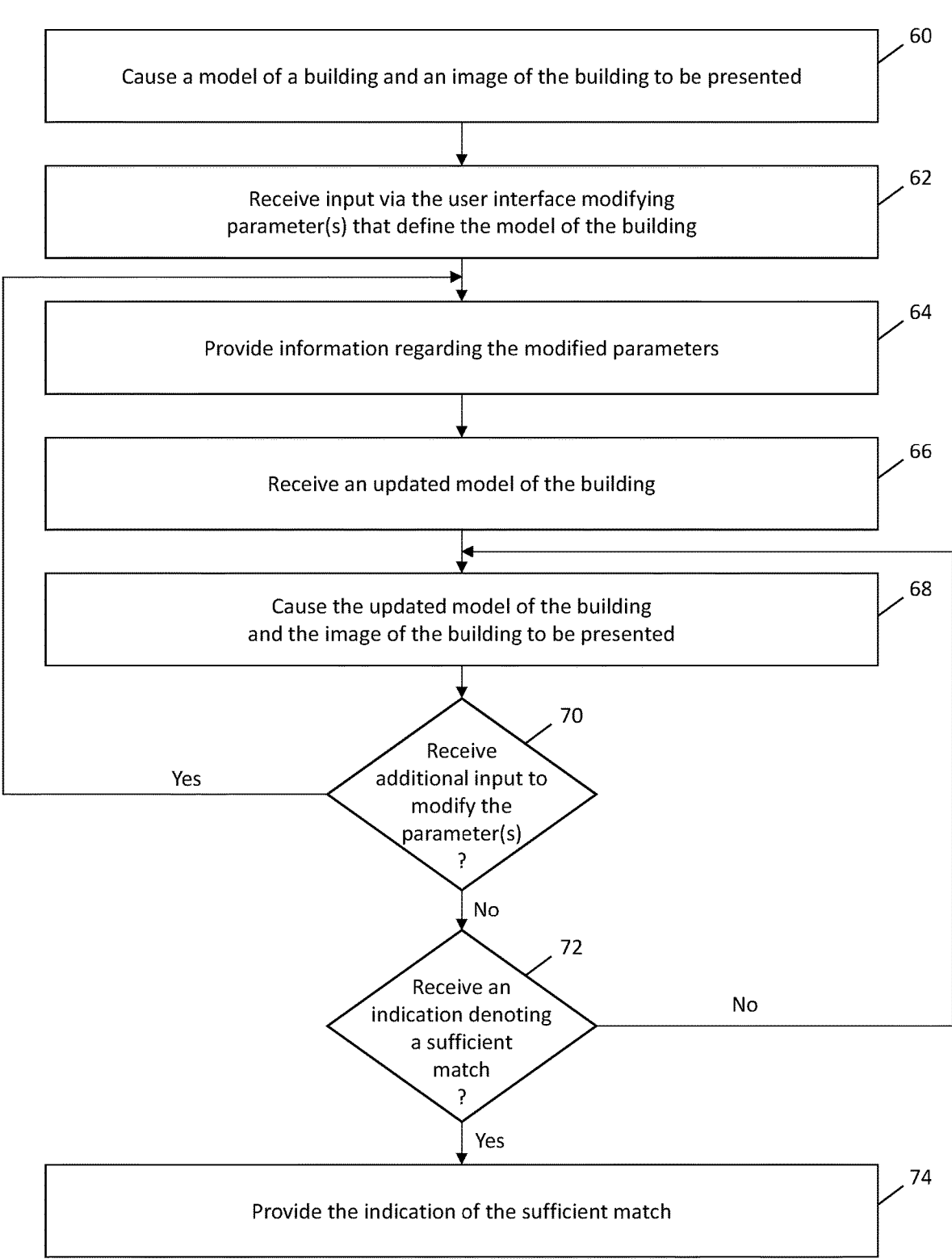

Having thus described example embodiments of the present disclosure in general terms, reference will now be made to the accompanying drawings, which are not necessarily drawn to scale, and wherein:

FIG. 1 is a block diagram of a system that facilitates the updating of a model of a building based upon an image of the same building in accordance with an example embodiment of the present disclosure;

FIG. 2 is a block diagram of a computing device configured to update the model of the building in accordance with an example embodiment of the present disclosure;

FIG. 3 is a flow chart illustrating the operations performed, such as by the computing device of FIG. 2 as embodied by a server or other network device, in order to update the model of a building in accordance with an example embodiment of the present disclosure;

FIG. 4 illustrates a model of a building overlayed upon an image of the same building;

FIG. 5 is a flow chart illustrating the operations performed, such as by the computing device of FIG. 2 as embodied by a user device, such as a mobile device, in order to update the model of a building in accordance with an example embodiment of the present disclosure; and FIG. 6 is an example of a user interface for providing feedback in response to presentation of the model of the building and the image of the building in accordance with an example embodiment of the present disclosure.

DETAILED DESCRIPTION

Some embodiments of the present invention will now be described more fully hereinafter with reference to the accompanying drawings, in which some, but not all, embodiments of the invention are shown. Indeed, various embodiments of the invention may be embodied in many different forms and should not be construed as limited to the embodiments set forth herein; rather, these embodiments are provided so that this disclosure will satisfy applicable legal requirements. Like reference numerals refer to like elements throughout. As used herein, the terms "data," "content," "information," and similar terms may be used interchangeably to refer to data capable of being transmitted, received and/or stored in accordance with embodiments of the present invention. Thus, use of any such terms should not be taken to limit the spirit and scope of embodiments of the present invention.

A computing device, method and computer program product are provided in accordance with an example embodiment in order to update the model of a building. The model of the building is updated based upon an image of the same building that has been captured. By updating the model of a building, the model will more accurately represent the building and, as a result, provide for improved performance in conjunction with various applications that rely upon the model of the building. For example, the model may be improved by providing additional or refined information regarding the floors of the building such that applications including navigation and other applications that rely upon the accurate identification of the location of a user device, e.g., a mobile device, can more accurately identify the floor upon which the device is located and provide relevant information based thereupon. Additionally or alternatively, the improvements to the model of the building may relate to the external size, shape and/or location of the building. As such, applications, such as mapping and navigation applications, may rely upon the improved model of the building in order to present a more accurate representation of the building, thereby providing for enhanced visualization and recognition.

A system for updating the model of a building is depicted in FIG. 1. The system of this example embodiment includes a computing device to update the model of the building. In the illustrated embodiment, the computing device configured to update the model of the building is a server 10. However, the computing device configured to update the model of the building may be any of a variety of other types of computing devices including, but not limited to, other types of network-based computing devices. As shown, the system includes a model database 14 configured to store information defining the models of a plurality of buildings. As described below, the information defining the model of a building includes a number of parameters including vertical parameters defining the height of the building, the number of floors of the building, etc. and/or horizontal parameters defining the footprint of the building, such as the width and the length of the building, the location of the building, the orientation of the building or the like. Thus, the model of a building is not an image of the building, but is a representation, such as a geometrical construct, of the building. The model of the building therefore generally provides a representation of the shape and volume of the building and is associated with the same location or approximately the same location as that of the building. The model database may be embodied by any of a variety of memory devices. As shown in FIG. 1, the model database is separate from, but in communication with, the computing device embodied as a server. Alternatively, the computing device, such as the server, configured to update the model of the building may also include the model database.

The system of the embodiment of FIG. 1 also includes an image capturing device 12. The image capturing device is configured to capture an image of the building. The image capturing device may be embodied by a camera, such as a camera carried by an individual or a camera carried by a vehicle that is designed to capture a plurality of images of an environment, such as an urban setting. The image capturing device may be configured to capture a single image or a plurality of sequential images, such as a video, of the building. As shown, the computing device, such as the server 10, configured to update the model of a building is also in communication with the image capturing device. Alternatively, the image capturing device may be configured to provide the image(s) of the building that have been captured to an intermediate device and/or to store the image(s) of the building in a memory device. In this alternative embodiment, the computing device, such as the server, configured to update the model of the building may be configured to access or otherwise obtain the image(s) captured by the image capturing device, such as from the intermediate device or from a memory device, without direct communication with the image capturing device.

Further, the system of the embodiment of FIG. 1 includes one or more user devices 16, one of which is depicted by way of example in FIG. 1. A user device of this example embodiment includes a user interface 18 to receive input and to provide the computing device, such as the server 10, with corresponding feedback regarding the model of the building in response to presentation of the model of the building and the image of the building, such as upon a display of the user device. As such, the user device and the computing device, such as the server, configured to update the model of the building may also be in communication, directly or indirectly, to facilitate the provision of the feedback from the user device to the computing device, such as the server, configured to update the model of the building.

Referring now to FIG. 2, the computing device 20 of an example embodiment is depicted. The computing device of FIG. 2 may be embodied by a server 10 or other network-based computing device configured to update the model of the building. Alternatively, the computing device may be embodied by a user device 16, such as, but not limited to, a mobile device, e.g., a mobile telephone, personal navigation device or the like, configured to provide information regarding one or more of the parameters that define the model of the building, following user input via the user device that serves to modify the parameter(s).

As illustrated, the computing device 20 includes, is associated with or is in communication with processing circuitry 22, a memory device 24, a communication interface 26, and optionally (as indicated by the dashed outline) a user interface 28, as shown in FIG. 2. In some embodiments, the processing circuitry (and/or co-processors or any other processors assisting or otherwise associated with the processing circuitry) can be in communication with the memory device via a bus for passing information among components of the computing device. The memory device can be non-transitory and can include, for example, one or more volatile and/or non-volatile memories. In other words, for example, the memory device may be an electronic storage device (for example, a computer readable storage medium) comprising gates configured to store data (for example, bits) that can be retrievable by a machine (for example, a computing device like the processing circuitry). The memory device can be configured to store information, data, content, applications, instructions, or the like for enabling the computing device to carry out various functions in accordance with an example embodiment of the present disclosure. For example, the memory device can be configured to buffer input data for processing by the processing circuitry. Additionally or alternatively, the memory device can be configured to store instructions for execution by the processing circuitry.

The processing circuitry 22 can be embodied in a number of different ways. For example, the processing circuitry may be embodied as one or more of various hardware processing means such as a processor, a coprocessor, a microprocessor, a controller, a digital signal processor (DSP), a processing element with or without an accompanying DSP, or various other processing circuitry including integrated circuits such as, for example, an ASIC (application specific integrated circuit), an FPGA (field programmable gate array), a microcontroller unit (MCU), a hardware accelerator, a special-purpose computer chip, or the like. As such, in some embodiments, the processing circuitry can include one or more processing cores configured to perform independently. A multi-core processor can enable multiprocessing within a single physical package. Additionally or alternatively, the processing circuitry can include one or more processors configured in tandem via the bus to enable independent execution of instructions, pipelining and/or multithreading.

In an example embodiment, the processing circuitry 22 can be configured to execute instructions stored in the memory device 24 or otherwise accessible to the processing circuitry. Alternatively or additionally, the processing circuitry can be configured to execute hard coded functionality. As such, whether configured by hardware or software methods, or by a combination thereof, the processing circuitry can represent an entity (for example, physically embodied in circuitry) capable of performing operations according to an embodiment of the present disclosure while configured accordingly. Thus, for example, when the processing circuitry is embodied as an ASIC, FPGA or the like, the processing circuitry can be specifically configured hardware for conducting the operations described herein. Alternatively, as another example, when the processing circuitry is embodied as an executor of software instructions, the instructions can specifically configure the processing circuitry to perform the algorithms and/or operations described herein when the instructions are executed. However, in some cases, the processing circuitry can be a processor of a specific device (for example, a computing device) configured to employ an embodiment of the present disclosure by further configuration of the processor by instructions for performing the algorithms and/or operations described herein. The processing circuitry can include, among other things, a clock, an arithmetic logic unit (ALU) and/or one or more logic gates configured to support operation of the processing circuitry.

The computing device 20 of an example embodiment can also include the communication interface 26. The communication interface can be any means such as a device or circuitry embodied in either hardware or a combination of hardware and software that is configured to receive and/or transmit data from/to other electronic devices in communication with the computing device, such as by providing for communication in the example embodiment of FIG. 1 between the server 10 and the user device 16 as well as communication with a model database 12 and/or an image capturing device 14. The communication interface can be configured to communicate in accordance with various wireless protocols including Global System for Mobile Communications (GSM), such as but not limited to Long Term Evolution (LTE). In this regard, the communication interface can include, for example, an antenna (or multiple antennas) and supporting hardware and/or software for enabling communications with a wireless communication network. Additionally or alternatively, the communication interface can include the circuitry for interacting with the antenna(s) to cause transmission of signals via the antenna(s) or to handle receipt of signals received via the antenna(s). In some environments, the communication interface can alternatively or also support wired communication.

The computing device 20 of an example embodiment may also include or otherwise be in communication with a user interface 28. For example, in an embodiment in which the computing device is instantiated as a user device 16, the computing device may include a user interface. The user interface may include a touch screen display, a speaker, physical buttons, and/or other input/output mechanisms. In an example embodiment, the processing circuitry 22 may comprise user interface circuitry configured to control at least some functions of one or more input/output mechanisms. The processing circuitry and/or user interface circuitry may be configured to control one or more functions of one or more input/output mechanisms through computer program instructions (for example, software and/or firmware) stored on a memory accessible to the processing circuitry (for example, memory device 24, and/or the like).

Referring now to FIG. 3, the operations performed, such as by the computing device 20 of FIG. 2 as embodied by a server 10 or other network-based computing device, are depicted. As shown in block 30, the computing device includes means, such as the processing circuitry 22, the communication interface 26 or the like, for obtaining an image of a building and information regarding the location from which the image was captured, that is, the location at which the image capturing device 14 was located at the time that the image of the building was captured. As noted above, the computing device may be configured to obtain the image of the building from the image capturing device. Alternatively, the computing device may receive the image of the building that was previously captured by an image capturing device from a memory device or from another intermediate device that received the image, directly or indirectly, from the image capturing device. In an embodiment in which the image of the building that is obtained is a video, the computing device, such as the processing circuitry, is configured to identify one of the images, such as the last of the plurality of sequential images that comprise the video, to be utilized for updating the model of the building as described below. In addition to the image of the building, the computing device, such as the processing circuitry, the communication interface or the like, is also configured to obtain the information regarding the location from which the image was captured and optionally the orientation from which the image was captured. In this regard, the image capturing device may be configured to identify its location and optionally its orientation at the time at which the image of the building was captured. The information regarding location and optionally orientation may be defined in various manners, such as by reference to a global navigation satellite system (GNSS) and/or inertial sensors, e.g., accelerometers and/or magnetometers, or based upon user input. The information regarding the location and optionally the orientation from which the image was captured may be provided in conjunction with the image.

As shown in block 32, the computing device 20 also includes means, such as the processing circuitry 22, the communication interface 26 or the like, for obtaining a model of the building. In the embodiment depicted in FIG. 1, the computing device is configured to obtain the model of the building from the model database 12. Alternatively, the computing device may be configured to obtain the model of the building from other sources. For example, the model may be stored by the memory device 24 of the computing device such that the processing circuitry accesses the model of the building from within the associated memory device. As described below, the model of the building is defined by a plurality of parameters relating to the overall building and the individual floors of the building. The parameters may initially be set to predefined or default values or at least some of the parameters may be set to initial values identified from reference to maps or other reference materials. The parameters are then subject to modification in order to modify the model as described below to more accurately represent the actual building. The building for which the model is to be obtained may be identified by the computing device, such as the processing circuitry, in various manners. For example, the building may be identified based upon user input. Alternatively, the building may be identified based upon the image of the building captured by the image capturing device. In this regard, the building may be identified based upon its location relative to the location and/or orientation of the image capturing device at the time that the image was captured, and/or based upon the external appearance or other indicia of the building.

The computing device 20 also includes means, such as the processing circuitry 22, the communication interface 26 or the like, for causing the model of the building and the image of the building to be presented, such as upon a display of the user device 16. See block 34. The model of the building and the image of the same building may be presented in various manners. For example, the model of the building and the image of the building may be presented in a side-by-side manner for purposes of visual comparison. Alternatively, the computing device, such as the processing circuitry, the communication interface or the like, may be configured to cause the model and the image of the building to be overlayed, such as depicted in FIG. 4. In this regard, the image 50 of the building including doors 54 and a plurality of windows 56 is presented in solid lines, while the model 52 of the building is presented in dashed lines. Although the image depicts and the model represents the same building, the model of the building is slightly displaced from and has a different height than the image of the building. These differences between the model and the image are provided by way of example and the model and the image of a building may differ in other manners and in other degrees in other instances.

In relation to the presentation of the model of the building, the computing device 20 of an example embodiment includes means, such as the processing circuitry 22 or the like, for causing the model of at least that portion of the building appearing in the image captured by the image capturing device 14 to be presented. Thus, the computing device, such as the processing circuitry, is configured to cause the same side or sides of the building that are visible within the image of the building that has been captured to be presented in terms of the model.

In at least some embodiments, the model of the building and the image of the building are defined in different coordinate frames. For example, the model of the building may be defined in a global coordinate frame, while the image of the building may be defined in a local coordinate frame. In this regard, the local coordinate frame may be defined by the image capturing device 14 and, more particularly, by the location and/or orientation of the image capturing device. To facilitate the presentation of the model of the building and the image of the building and a comparison therebetween, the computing device 20, such as the processing circuitry 22, is configured to convert at least one of the image of the building or the model of the building to a different coordinate frame such that, following conversion, the image of the building and the model of the building are defined in a common coordinate frame. For example, the model of the building may be converted to the local coordinate frame, or the image of the building may be converted to the global coordinate frame.

In addition to ensuring that the model of the building and the image of the building are in the same coordinate frame, the computing device 20, such as the processing circuitry 22, is configured to project the model of the building onto the image plane defined by the image captured by the image capturing device 14. In order to project the model of the building onto the image plane, the computing device, such as the processing circuitry, is configured to receive the projection matrix and, optionally, one or more distortion coefficients from the image capturing device, either directly or indirectly, and to utilize the projection matrix and any distortion coefficients to project the model of the building onto the image plane. For example, the model of the building may be represented as a three-dimensional (3D) vector model. In this example embodiment, the computing device, such as the processing circuitry, is configured to project the vectors of the 3D vector model onto the image plane utilizing the projection matrix of the image capturing device and any distortion coefficients. Among other things, the projection matrix may be configured to take into account zoom parameters of the imaging device so that the model of the building and the image of the building have the same scaling. In some embodiments, however, the computing device, such as the processing circuitry, may be configured to provide for additional scaling of the model to account for, for example, further zooming of the image of the building.

Based upon the presentation of the model of the building and the image of the building, the computing device 20 includes means, such as the processing circuitry 22 or the like, for determining whether a sufficient match exists between the model of the building and the image of the building. See block 36 of FIG. 3. The sufficiency of the match may be defined in various manners. For example, the sufficiency of the match may be defined in an automated manner. In one embodiment, the computing device 20, such as the processing circuitry 22, may be configured to perform an automated analysis, such as an automated image analysis, of the model of the building and the image of the building to determine whether the model of the building and the image of the building match to within a predefined amount or a predefined percent (or differ by less than a predefined amount or a predefined percent). The match between the model of the building and the image of the building may be defined by the computing device in various manners, such as based upon a comparison of the outline of the exterior of the building in the model and in the image and a determination as to the amount by which the outlines differ from one another, such as in terms of the maximum difference, the average difference or the like. In an instance in which the model of the building and the image of the building satisfy a predetermined threshold by matching to within the predefined amount or the predefined percent, the computing device, such as the processing circuitry, is configured to determine that there is a sufficient match between the model and the image of the building. However, in an instance in which the computing device, such as the processing circuitry, determines that the amount or percent of match between the model of the building and the image of the building is less than the predetermined threshold, the computing device, such as the processing circuitry, is configured to determine that the model of the building and the image of the building do not sufficiently match.

Alternatively, the sufficiency of the match between the model of the building and the image of the building may be defined manually, such as by a user following review of the presentation of the model of the building and the image of the building. In this regard, the user may provide, such as via the user interface 18 of a user device 16, input following the presentation of the model of the building and the image of the building as to whether the model and the image of the building sufficiently match one another. Still further, the sufficiency of the match between the model of the building and the image of the building may be defined by a combination of automated and manual processes. In this example embodiment, the computing device 20, such as the processing circuitry 22, may be configured to determine the extent to which the model of the building and the image of the building match, such as by determining, e.g., a measure of the difference between the exterior outlines of the model of the building and the image of the building. The computing device may then provide information of the extent to which the model of the building and the image of the building match, such as via the user interface of the user device, so as to obtain input by the user as to whether the model of the building and the image of the building sufficiently match or not.

As show in block 38 of FIG. 3, the computing device 20 also includes means, such as the processing circuitry 22, the communication interface 26 or the like, for receiving feedback from the presentation of the model of the building and the image of the building. The feedback relates to any misalignment between the model of the building and the image of the building and/or measures to reduce any such misalignment, such as feedback intended to modify parameter(s) of the model such that the modified version of the model is more closely aligned with the image of the building. The feedback may be provided in various manners. For example, the feedback may be manual feedback provided, for example, by user via the user interface 18 of a user device 16. During presentation of the model of the building and the image of the building, for example, the user may review the presentation and provide feedback intended to bring the model of the building into closer alignment with the image of the same building. Alternatively, the computing device, such as the processing circuitry, may be configured to performing automated analysis, such as automated image analysis, of the model of the building and the image of the building that are presented and to provide the feedback based upon the automated analysis. In this regard, the feedback provided by the automatic analysis is also intended to modify one or more parameters that define the model of the building in order to bring the model of the building into closer alignment with the image of the building.

Based on the feedback that is received following presentation of the model of the building and the image of the building, the computing device 20 includes means, such as the processing circuitry 22 or the like, for updating the model of the building by adjusting one or more parameters defining the model of the building. See block 40 of FIG. 3. Although various parameters may be adjusted, the computing device, such as the processing circuitry, of an example embodiment is configured to adjust one or more vertical parameters. In this regard, the one or more vertical parameters may include the number of floors of the building, the respective heights of one or more of the floors including the respective height of the ground floor and the respective heights of the higher floors above the ground floor and the altitudes of one or more of the floors, such as the respective altitude of the ground floor and respective attitudes of one or more the higher floors. In this regard, a height of a floor refers to the spacing of the floor from the adjacent floor(s). Additionally or alternatively, the computing device, such as the processing circuitry, of an example embodiment is configured to adjust one or more horizontal parameters that define the model of the building. For example, the horizontal parameters may include the length of the building, the width of the building, the position of the building and/or the orientation of the building.

By way of illustration, the feedback provided following the presentation of the model 52 of the building and the image 50 of the building of FIG. 4 may indicate that the model of the building should be taller and that the model of the building should be shifted to the left. As such, the parameters that define the height of the building and the location of the building may be modified based on the feedback so that the model of the building and the image of the building are more closely aligned. Additional feedback may be provided identifying the height and/or altitudes of the individual floors of the building.

While the feedback may specifically provide for updates of the information associated with individual floors, such as the height of a floor or the altitude of a floor, the feedback may provide for updates to the overall shape and size of the building with the parameters associated with the individual floors then being correspondingly adjusted based upon updates to the overall building size. For example, feedback that causes an increase in the size of a building by 10% may also cause each floor to increase in height by 10%.

As shown in block 42 of FIG. 3, the computing device 20 also includes means, such as the processing circuitry 22, the communication interface 26 or the like, for causing the updated model of the building and the image of the building to be presented. In this regard, the updated model of the building includes the model of the building following modification of one or more parameters that define the model of the building based upon the feedback that was previously received. As depicted in FIG. 3 and, in particular, block 36 of FIG. 3, the presentation of the updated model of the building and the image of the building permits a determination to be made as to whether there is a sufficient match between the updated model and the image of the building. In an instance in which a sufficient match exists as described above, the process of updating the model of the building concludes. However, in an instance in which the updated model of the building and the image of the building are determined not to sufficiently match, the process of receiving feedback and then further updating the model of the building can repeat one or more additional times until there is a sufficient match between the updated model and the image of the building. As such, the computing device of an example embodiment includes means, such as the processing circuitry or the like, for causing the updated model of the building and the image of the building to be repeatedly presented and to then receive additional feedback from which the model of the building is further updated with the process continuing until the computing device, such as the processing circuitry, the communication interface or the like, receives an indication denoting a sufficient match between the model of the building and the image of the building.

In an instance in which images of the different sides or surfaces of the building are captured by an image capturing device 14, the computing device 20, such as the processing circuitry 22, is configured to repeat the foregoing process described above in relation to FIG. 3 for each or at least two or more of the different side(s) of the building that are shown in the different images of the building. As a result, the resulting model of the building may be further refined based upon feedback provided and updates introduced based upon a comparison of the model with the different side(s) of the building depicted in different images.

By having updated the model of the building, the resulting updated model is more accurate and reflective of the building. In this regard, the updated model may more accurately represent the building and the individual floors within the building. As such, the updated model of the building may provide for improved and more accurate visualization of the building, such as in conjunction with a mapping or navigation application. Additionally, the updated model of the building may provide additional and more accurate information regarding the individual floors of the building so as to improve the accuracy with which user, device, such as a mobile device on one of the floors may be located, thereby enhancing navigation and other applications that rely upon the accurate determination of the location of a user device.

Referring to FIG. 5, the operations performed, such as by the computing device 20 of FIG. 2 as embodied by a user device 16, such as a mobile device, e.g., mobile telephone, a personal navigation device or the like, are depicted. As shown in block 60 of FIG. 5, the computing device of this example embodiment includes means, such as the processing circuitry 22, the user interface 28 or the like, for causing a model of the building and an image of the building to be presented. In this regard, the model of the building and the image of the building may be provided by another computing device, such as a server 10 or a network-based computing device, with the model of the building and the image of the building then being presented, such as upon the display of the user device. As described above, the model of the building and the image of the building may be presented in various manners to permit a comparison therebetween. For example, the model of the building and the image of the building may be presented in a side-by-side manner or the model of the building and the image of the building may be overlayed as shown in FIG. 4.

The computing device 20 of this example embodiment also includes means, such as the processing circuitry 22, the user interface 28 or the like, for receiving input via the user interface modifying one or more parameters that define the model of the building. See block 62 of FIG. 5. As described above, various parameters may be modified. For example, the input that is received may be configured to adjust one or more vertical parameters. In this regard, the one or more vertical parameters may include the number of floors of the building, the respective heights of one or more of the floors including the respective height of the ground floor and the respective heights of the higher floors above the ground floor and the altitudes of one or more of the floors, such as the respective altitude of the ground floor and respective attitudes of one or more the higher floors. Additionally or alternatively, the input that is received may be configured to adjust one or more horizontal parameters that define the model of the building. For example, the horizontal parameters may include the length of the building, the width of the building, the position of the building and/or the orientation of the building.

The parameters may be modified in various manners. For example, the user interface 28 may cause a display to be presented that identifies a plurality of parameters that include editable fields that permit the user to provide input to define the various parameters. In this regard, FIG. 6 is one example of a user interface having a display 80 with a plurality of editable fields represented by the short horizontal lines that are configured to receive input from the user regarding vertical and horizontal parameters that define the model of the building. Alternatively, the display upon which the model of the building and the image of the building are presented may be a touch screen configured to receive input from the user to modify the representation of the model of the building. For example, the user may select, e.g., touch, a vertex, edge or other feature of the representation of the model of the building, such as one of the top corners of the representation of the model of the building, and then drag or otherwise move the selected feature into closer alignment with a corresponding feature from the image of the building. Based upon the input provided by the user in this example embodiment, the parameters that define the model may be correspondingly revised.

With reference to the overlaid model of the building and the image of the building of FIG. 4, the user may touch the top left corner of the model of the building and may drag the top left corner upwardly and to the left into alignment with the top left corner of the image of the building. Additionally, the user may touch the top right corner of the model of the building and may drag the top right corner upwardly and to the left into alignment with the top right corner of the image of the building. Based upon this user input, the computing device 20, such as the processing circuitry 22, may be configured to modify the parameters defining the height of the building and the location of the building such that the updated model more closely represents the image of the building.

The computing device 20 embodied by the user device 16 also includes means, such as the processing circuitry 22, the communication interface 26 or the like, for providing information regarding the modified parameters. See block 64 of FIG. 5. For example, the computing device, such as the processing circuitry, the communication interface or the like, may be configured to provide the modified parameters to the computing device, such as the server 10 or other network-based computing device, that is configured to update the model of the building. Thereafter, the computing device embodied by the user device includes means, such as the processing circuitry, the communication interface or the like, for receiving an updated model of the building. See block 66. In this regard, the computing device, such as the processing circuitry, the communication interface or the like, is configured to receive the updated model of the building from the computing device, such as the server 10 or other network-based computing device, that is configured to update the model of the building.

The computing device 20 embodied by the user device 16 also includes means, such as the processing circuitry 22, the user interface 28 or the like, for causing the updated model of the building and the image of the building to be presented, such as upon the display of the user device. See block 68 of FIG. 5. Based upon the presentation of the updated model of the building and the image of the building, the computing device, such as the processing circuitry, the user interface or the like, is configured to determine whether any additional input to modify one or more parameters that define the model of the building has been received, such as via the user interface. See block 70 of FIG. 5. In an instance in which additional input serving to modify one or more parameters that define the model of the building has been received, the information regarding the modified parameters is again provided as shown in block 64 to the computing device embodied by the server 10 or other network-based computing device and the foregoing process is repeated.

However, if additional input serving to modify the one or more parameters that define the model of the building is not received, the computing device 20 embodied by the user device 16 also includes means, such as a processing circuitry 22, the user interface 28 or the like, for determining whether an indication denoting a sufficient match has been received. See block 72 of FIG. 5. An indication denoting a sufficient match may be provided manually or in automated manner. In regards to the manual provision of the indication, the sufficiency of the match between the model of the building and the image of the building may be provided by input from a user, such as via the user interface 28, following a review of the presentation of the model of the building and the image of the building. Alternatively, an indication of the sufficiency of the match may be provided in an automated manner. For example, the computing device 20 embodied by the user device, such as the processing circuitry 22, may be configured to perform an automated analysis, such as an automated image analysis, of the model of the building and the image of the building to determine whether the model of the building and the image of the building match to within a predefined amount or a predefined percent (or differ by less than a predefined amount or a predefined percent). In an instance in which the model of the building and the image of the building satisfy a predetermined threshold by matching to within the predefined amount or the predefined percent, the computing device, such as the processing circuitry, is configured to determine that there is a sufficient match between the model and the image of the building and an indication as to the sufficiency of the match is provided. However, in an instance in which the computing device, such as the processing circuitry, determines that the amount or percent of match between the model of the building and the image of the building is less than the predetermined threshold, the computing device, such as the processing circuitry, is configured to determine that the model of the building and the image of the building do not sufficiently match and no indication of the sufficiency is provided.

In an instance in which no indication denoting the sufficiency of the match between the model and the image of a building has been received, the updated model of the building and the image of the building is repeatedly presented as shown in block 68 until either additional input to modify one or more parameters that define the model of the building are received as shown in block 70 or an indication denoting a sufficient match has been received as shown in block 72. Thereafter, once an indication indicating that there is a sufficient match has been received, the computing device 20 embodied by the user device 16 includes means, such as the processing circuitry 22, the communication interface 28 or the like, for providing the indication of the sufficient match, such as to the computing device embodied by the server 10 or other network-based computing device, in order to provide for updating of the model of the building.

As described above, FIGS. 3 and 5 are flow diagrams of a computing devicee 20, method, and computer program product configured to update the model of a building based upon an image that has been captured of the same building. It will be understood that each block of the flow diagrams, and combinations of blocks in the flow diagrams, may be implemented by various means, such as hardware, firmware, processing circuitry 22, and/or other devices associated with execution of software including one or more computer program instructions. For example, one or more of the procedures described above may be embodied by computer program instructions. In this regard, the computer program instructions which embody the procedures described above may be stored by the memory device 24 of the computing device and executed by the processing circuitry or the like. As will be appreciated, any such computer program instructions may be loaded onto a computer or other programmable apparatus (e.g., hardware) to produce a machine, such that the resulting computer or other programmable apparatus implements the functions specified in the flowchart blocks. These computer program instructions may also be stored in a computer-readable memory that may direct a computer or other programmable apparatus to function in a particular manner, such that the instructions stored in the computer-readable memory produce an article of manufacture the execution of which implements the function specified in the blocks of the flow diagrams. The computer program instructions may also be loaded onto a computer or other programmable apparatus to cause a series of operations to be performed on the computer or other programmable apparatus to produce a computer-implemented process such that the instructions which execute on the computer or other programmable apparatus provide operations for implementing the functions specified in the blocks of the flow diagrams.

Accordingly, blocks of the flow diagrams support combinations of means for performing the specified functions and combinations of operations for performing the specified functions. It will also be understood that one or more blocks of the flow diagrams, and combinations of blocks in the flow diagrams, can be implemented by special purpose hardware-based computer systems which perform the specified functions, or combinations of special purpose hardware and computer instructions.

In some embodiments, certain ones of the operations above may be modified or further amplified. Furthermore, in some embodiments, additional optional operations may be included. Modifications, additions, or amplifications to the operations above may be performed in any order and in any combination.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

That which is claimed:

1. A computing device comprising processing circuitry and at least one memory including computer program code, the at least one memory and the computer program code configured to, with the processing circuitry, cause the computing device at least to:

obtain an image of a building and information regarding a location from which the image was captured;

cause a model of the building and the image of the building to be presented;

based on feedback from presentation of the model of the building and the image of the building, update the model of the building by adjusting one or more parameters, including one or more vertical parameters, defining the model of the building; and cause the updated model of the building and the image of the building to be presented.

2. The computing device according to claim 1, wherein the at least one memory and the computer program code are configured to, with the processing circuitry, cause the computing device to update the model of the building by automatically adjusting the one or more parameters defining the model of the building in response to the feedback in a form of manual feedback provided during presentation of the model of the building and the image of the building.

3. The computing device according to claim 1, wherein the at least one memory and the computer program code are further configured to, with the processing circuitry, cause the computing device to perform an automated analysis of the model of the building and the image of the building that are presented and to provide the feedback based on the automated analysis.

4. The computing device according to claim 1, wherein the at least one memory and the computer program code are further configured to, with the processing circuitry, cause the computing device to obtain information regarding an orientation of an image capturing device upon capturing the image of the building.

5. The computing device according to claim 4, wherein the at least one memory and the computer program code are further configured to, with the processing circuitry, cause the computing device to obtain the model of the building, and wherein the computing device being caused to present the model of the building comprises the computing device being caused to present the model of at least that portion of the building appearing in the image captured by the image capturing device having the orientation and being at the location.

6. The computing device according to claim 1, wherein the computing device being caused to present the model of the building and the image of the building comprises the computing device being caused to overlay the model of the building and the image of the building.

7. The computing device according to claim 1, wherein the one or more vertical parameters comprise at least one of: (i) a number of floors, (ii) respective heights of one or more of the floors or (iii) respective altitudes of one or more of the floors.

8. The computing device according to claim 1, wherein the one or more parameters that are adjusted comprise one or more horizontal parameters including at least one of a length of the building, a width of the building, a position of the building or an orientation of the building.

9. The computing device according to claim 1, wherein the feedback is received via a user interface, and wherein the at least one memory and the computer program code are further configured to, with the processing circuitry, repeatedly cause the updated model of the building and the image of the building to be presented in order to obtain additional feedback from which the model of the building is updated until an indication is received denoting a sufficient match between the updated model of the building and the image of the building.

10. The computing device according to claim 9, wherein the at least one memory and the computer program code are further configured to, with the processing circuitry, receive the feedback via the user interface of a user device that is also configured to present the model of the building and the image of the building.

11. A computing device comprising processing circuitry and at least one memory including computer program code, the at least one memory and the computer program code configured to, with the processing circuitry, cause the computing device at least to:

obtain an image of a building and information regarding a location from which the image was captured;

cause a model of the building and the image of the building to be presented;

during presentation of the model of the building and the image of the building, receive input modifying one or more parameters, including one or more vertical parameters, that define the model of the building;

update the model of the building based on the input; and repeatedly cause the updated model of the building and the image of the building to be presented in order to obtain additional input based on which the model of the building is further updated until an indication is received denoting a sufficient match between the model of the building and the image of the building.

12. The computing device according to claim 11, wherein the at least one memory and the computer program code are further configured to, with the processing circuitry, cause the computing device to obtain information regarding an orientation of an image capturing device upon capturing the image of the building.

13. The computing device according to claim 12, wherein the at least one memory and the computer program code are further configured to, with the processing circuitry, cause the computing device to obtain the model of the building, and wherein the computing device being caused to present the model of the building comprises the computing device being caused to present the model of at least that portion of the building appearing in the image captured by the image capturing device having the orientation and being at the location.

14. The computing device according to claim 11, wherein the one or more vertical parameters comprise at least one of: (i) a number of floors, (ii) respective heights of one or more of the floors or (iii) respective altitudes of one or more of the floors.

15. The computing device according to claim 11, wherein the computing device being caused to receive input modifying one or more parameters comprises the computing device being caused to receive input modifying one or more horizontal parameters including at least one of a length of the building, a width of the building, a position of the building or an orientation of the building.

16. A computing device comprising processing circuitry and at least one memory including computer program code, the at least one memory and the computer program code configured to, with the processing circuitry, cause the computing device at least to:

cause a model of a building and an image of the building to be presented;

during presentation of the model of the building and the image of the building, receive input via a user interface provided by the computing device, wherein the input modifies one or more parameters, including one or more vertical parameters, that define the model of the building;

provide information regarding the one or more parameters, as modified by the input;

receive an updated model of the building; and cause the updated model of the building and the image of the building to be presented in order to obtain, via the user interface, (i) additional input based on which the model of the building is further updated or (ii) an indication denoting a sufficient match between the model of the building and the image of the building.

17. The computing device according to claim 16, wherein the computing device being caused to present the model of the building comprises the computing device being caused to present the model of at least that portion of the building appearing in the image captured by an image capturing device.

18. The computing device according to claim 16, wherein the computing device being caused to present the model of the building and the image of the building comprises the computing device being caused to overlay the model of the building and the image of the building.

19. The computing device according to claim 16, wherein the one or more vertical parameters comprise at least one of: (i) a number of floors, (ii) respective heights of one or more of the floors or (iii) respective altitudes of one or more of the floors.

20. The computing device according to claim 16, wherein the computing device being caused to receive input via the user interface modifying one or more parameters comprises the computing device being caused to receive input via the user interface modifying one or more horizontal parameters including at least one of a length of the building, a width of the building, a position of the building or an orientation of the building.

* * * * *